(12) United States Patent
Zou et al.

(10) Patent No.: US 11,388,526 B2
(45) Date of Patent: Jul. 12, 2022

(54) MEMS MICROPHONE

(71) Applicant: GOERTEK, INC., Weifang (CN)

(72) Inventors: Quanbo Zou, Weifang (CN); Yongwei Dong, Weifang (CN)

(73) Assignee: Weifang Goertek Microelectronics Co., Ltd., Weifang (CN)

( * ) Notice: Subject to any disclaimer, the term of this patent is extended or adjusted under 35 U.S.C. 154(b) by 218 days.

(21) Appl. No.: 16/640,009

(22) PCT Filed: Sep. 6, 2018

(86) PCT No.: PCT/CN2018/104441
§ 371 (c)(1),
(2) Date: Feb. 18, 2020

(87) PCT Pub. No.: WO2020/000650
PCT Pub. Date: Jan. 2, 2020

(65) Prior Publication Data
US 2020/0260192 A1 Aug. 13, 2020

(30) Foreign Application Priority Data
Jun. 25, 2018 (CN) .......................... 201810663425.9

(51) Int. Cl.
| H04R 19/00 | (2006.01) |
| H04R 19/04 | (2006.01) |
| B81B 7/00 | (2006.01) |
| H04R 7/00 | (2006.01) |
| H01L 29/788 | (2006.01) |

(52) U.S. Cl.
CPC ............ *H04R 19/04* (2013.01); *B81B 7/008* (2013.01); *H04R 7/00* (2013.01); *B81B 2201/0257* (2013.01); *B81B 2203/0127* (2013.01); *B81B 2207/015* (2013.01); *B81B 2207/03* (2013.01); *B81B 2207/07* (2013.01); *H01L 29/788* (2013.01); *H04R 2201/003* (2013.01)

(58) Field of Classification Search
CPC .... H04R 19/04; H04R 7/00; H04R 2201/003; H04R 23/006; H04R 19/005; H04R 31/00; B81B 7/008; B81B 2201/0257; B81B 2203/0127; B81B 2207/015; B81B 2207/03; B81B 2207/07; H01L 29/788
See application file for complete search history.

(56) References Cited

U.S. PATENT DOCUMENTS

2012/0189143 A1   7/2012   Buhmann et al.

FOREIGN PATENT DOCUMENTS

| CN | 102967407 A | 3/2013 |
| JP | 2010045430 A | 2/2010 |
| WO | WO2007117198 A1 | 10/2007 |

*Primary Examiner* — Matthew A Eason
(74) *Attorney, Agent, or Firm* — Baker Botts, LLP

(57) ABSTRACT

An MEMS microphone is provided, comprising: a first substrate; a vibration diaphragm supported above the first substrate by a spacing portion, the first substrate, the spacing portion, and the vibration diaphragm enclosing a vacuum chamber, and a static deflection distance of the vibration diaphragm under an atmospheric pressure being less than a distance between the vibration diaphragm and the first substrate; and a floating gate field effect transistor outputting a varying electrical signal, the floating gate field effect transistor including a source electrode and a drain electrode both provided on the first substrate and a floating gate provided on the vibration diaphragm.

9 Claims, 2 Drawing Sheets

MEMS MICROPHONE

CROSS-REFERENCE TO RELATED APPLICATIONS

This application is a National Stage of International Application No. PCT/CN2018/104441, filed on Sep. 6, 2018, which claims priority to Chinese Patent Application No. 201810663425.9, filed on Jun. 25, 2018, both of which are hereby incorporated by reference in their entireties.

TECHNICAL FIELD

The present disclosure relates to the field of acoustic-electric conversion, and more particularly to an MEMS (micro electro-mechanical systems) microphone, especially a microphone structure with a high SNR (signal-to-noise ratio).

BACKGROUND

Prevailing MEMS microphones, such as a capacitive sensing structure and a piezoelectric sensing structure, are designed with a big back cavity with an ambient pressure, so as to ensure that the rigidity of flowing air is much smaller than that of the vibration diaphragm. A volume of the back cavity is generally much larger than 1 mm$^3$, and for example is generally designed to be 1-15 mm$^3$. Moreover, a cavity of a microphone chip needs to be open when the microphone chip is packaged, which limits a minimum package size of the MEMS microphone (>3 mm$^3$).

The reason is that if the volume of the back cavity is too small, a circulation of air is blocked, and the rigidity of the air will greatly reduce the mechanical sensitivity of the vibration diaphragm. In addition, for pressure equalization, dense perforation holes are usually designed in a backplate, and the air flow resistance in the gap or perforation holes caused by air viscosity becomes a dominant factor of the MEMS microphone noise, thereby limiting the high signal-to-noise ratio performance of the microphone.

SUMMARY

An object of the present disclosure is to provide a novel technical solution of an MEMS microphone.

According to a first aspect of the present disclosure, there is provided an MEMS microphone, comprising: a first substrate; a vibration diaphragm supported above the first substrate by a spacing portion, the first substrate, the spacing portion, and the vibration diaphragm enclosing a vacuum chamber, and a static deflection distance of the vibration diaphragm under an atmospheric pressure being less than a distance between the vibration diaphragm and the first substrate; and a floating gate field effect transistor outputting a varying electrical signal, the floating gate field effect transistor including a source electrode and a drain electrode both provided on the first substrate and a floating gate provided on the vibration diaphragm.

Optionally, the floating gate is provided on a side of the vibration diaphragm that is adjacent to or away from the vacuum chamber.

Optionally, the vibration diaphragm comprises a composite structure, the floating gate being provided in the composite structure of the vibration diaphragm.

Optionally, the vibration diaphragm has a mechanical sensitivity of 0.02 to 0.9 nm/Pa.

Optionally, an initial gap between the vibration diaphragm and the first substrate is 1-100 μm.

Optionally, the MEMS microphone further comprises an ASIC circuit integrated on the first substrate.

Optionally, the floating gate on the vibration diaphragm is electrically connected to a circuit layout on the first substrate via a lead.

Optionally, one end of the lead is electrically connected to the floating gate, and the other end of the lead extends on the vibration diaphragm to the spacing portion and passes through the spacing portion to connect to the circuit layout on the first substrate.

Optionally, a second substrate is further provided on a side of the vibration diaphragm that is away from the vacuum chamber, and an opening exposing the vibration diaphragm is formed on the second substrate at a position corresponding to a central region of the vibration diaphragm.

Optionally, a bonding pad for an external connection is provided on a side of the first substrate that is away from the vacuum chamber.

According to the MEMS microphone of the disclosure, the vacuum chamber is enclosed between the vibration diaphragm and the first substrate, and the air viscosity in the vacuum chamber is much lower than the air viscosity at the ambient pressure, thereby reducing an influence of acoustic resistance on a vibration of the vibration diaphragm, and improving a signal-to-noise ratio of the microphone. In addition, since such an MEMS microphone does not have a back cavity with a relatively large volume, an overall size of the MEMS microphone can be greatly reduced, and reliability of the microphone is enhanced.

Further features of the present disclosure and advantages thereof will become apparent from the following detailed description of exemplary embodiments according to the present disclosure with reference to the attached drawings.

BRIEF DESCRIPTION OF THE DRAWINGS

The accompanying drawings, which are incorporated in and constitute a part of the description, illustrate embodiments of the present disclosure and, together with the description thereof, serve to explain the principles of the present disclosure.

DETAILED DESCRIPTION

Technical problems to be solved, technical solutions to be adopted, and technical effects to be obtained by the present disclosure are to be easily understood from the further detailed description of particular embodiments according to the present disclosure in conjunction with the attached drawings.

Figure 1:
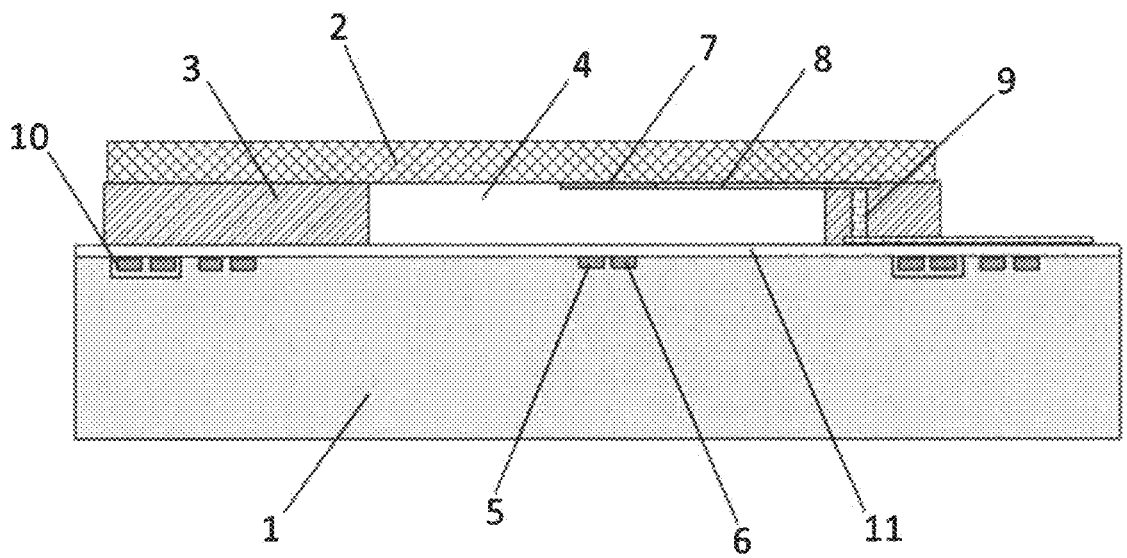
FIG. 1 is a schematic structural view of a first embodiment of a microphone of the present disclosure.

Referring to FIG. 1, the present disclosure provides an MEMS microphone comprising a first substrate 1 and a vibration diaphragm supported above the first substrate 1 by a spacing portion 3. The first substrate 1, the spacing portion 3, and the vibration diaphragm enclose a vacuum chamber 4.

The first substrate 1 according to the present disclosure can be made of monocrystalline silicon or other materials well known to those skilled in the art, and the spacing portion 3 and the vibration diaphragm supported on the first substrate 1 by the spacing portion 3 can be formed by depositing layer by layer, patterning and sacrificial processes. If necessary, an insulating layer 11 is further provided between the spacing portion 3 and the first substrate 1, which will not be specifically explained herein.

The vacuum chamber 4 can be sealed, for example, by low pressure plasma enhanced chemical vapor deposition (PECVD) at 200-350° C. Such MEMS process belongs to common general knowledge of those skilled in the art and will not be specifically explained herein. The vacuum chamber 4 has a pressure preferably less than 1 kPa, so that the air viscosity of residual air in the vacuum chamber 4 is much lower than the air viscosity at a standard pressure.

Since the vacuum chamber having an air pressure lower than the atmospheric pressure is formed between the vibration diaphragm and the first substrate 1, the vibration diaphragm is statically deflected under the atmospheric pressure and without a sound pressure, that is, the vibration diaphragm is statically deflected towards the first substrate 1. In order to prevent the vibration diaphragm from being deflected to get into contact with the first substrate 1 when the vibration diaphragm is static, a static deflection distance of the vibration diaphragm is designed to be less than a distance between the vibration diaphragm and the first substrate 1, which can be implemented mainly by changing the rigidity of the vibration diaphragm and/or the distance between the vibration diaphragm and the first substrate 1.

For example, the thickness of the vibration diaphragm can be increased, and of course, the rigidity of the vibration diaphragm may also be enhanced by selecting a suitable material of the vibration diaphragm 2. For example, the vibration diaphragm can be designed to have a mechanical sensitivity of 0.02 to 0.9 nm/Pa. That is to say, each time a pressure of 1 Pa is applied, the vibration diaphragm will have a deflection of 0.02-0.9 nm. The vibration diaphragm is 10-100 times as rigid as a conventional vibration diaphragm, so that the vibration diaphragm is rigid enough to resist the atmospheric pressure in an ambient environment.

An initial gap between the vibration diaphragm and the first substrate 1 can be designed in a range of 1-100 µm. The above-mentioned rigid vibration diaphragm will not collapse under the atmospheric pressure.

In order to improve the sensitivity of the MEMS microphone, the MEMS microphone may adopt a highly-sensitive detection structure, for example a floating gate field effect transistor.

In a specific embodiment of the present disclosure, the floating gate field effect transistor comprises a source electrode 5, a drain electrode 6 and a floating gate 7. The source electrode 5 and the drain electrode 6 can be formed on the first substrate 1 by processes well known in the art of transistor. The floating gate 7 can be provided on the vibration diaphragm 2.

The floating gate 7 can be provided on a side of the vibration diaphragm 2 that is adjacent to or away from the vacuum chamber 4.

Alternatively, the vibration diaphragm 2 may adopt a composite structure. For example, in order to form the vacuum chamber, a covering layer having sacrificial holes is firstly provided on a sacrificial layer, and the sacrificial layer below the covering layer is etched off through the sacrificial holes. A filling layer is then deposited above the covering layer to seal the sacrificial holes in the covering layer to form the vacuum chamber. The floating gate 7 can be provided in the composite structure of the vibration diaphragm 2 and will not be specifically explained herein.

As a capacitance between the floating gate 7 and the first substrate 1 changes when the floating gate 7 is varied during a vibration of the vibration diaphragm 2, the field effect transistor as whole outputs a varying electrical signal. The working principle of such a floating gate field effect transistor belongs to common general knowledge of those skilled in the art. The floating gate field effect transistor is applied to carry out detection in the microphone, such that the sensitivity of the MEMS microphone according to the present disclosure can be greatly improved.

According to the MEMS microphone of the disclosure, the vacuum chamber is enclosed between the vibration diaphragm and the first substrate 1, and the vacuum chamber has an air viscosity much lower than that of an ambient pressure, thereby reducing the influence of acoustic resistance on the vibration of the vibration diaphragm, and improving the signal-to-noise ratio of the microphone. In addition, since the MEMS microphone of such structure does not require a back cavity of a relatively large volume, the overall size of the MEMS microphone can be greatly reduced, and the reliability of the microphone is enhanced.

Figure 2:
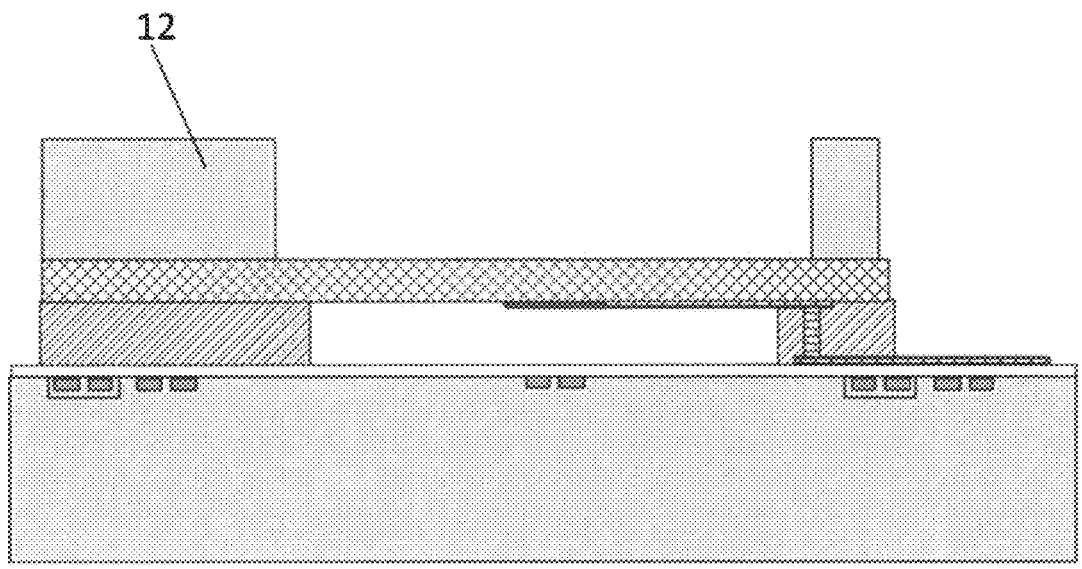
FIG. 2 is a schematic structural view of a second embodiment of the microphone of the present disclosure.

The MEMS microphone according to the present disclosure may also be manufactured by a bonding process in addition to a process of surface micromachining or bulk silicon micromachining. Referring to FIG. 2, a second substrate 12 is provided on a side of the vibration diaphragm that is away from the vacuum chamber 4, and an opening exposing the vibration diaphragm is provided on the second substrate 12 at a position corresponding to the central region of the vibration diaphragm.

During the manufacturing, by for example surface micromachining or bulk silicon micromachining, a part of the spacing portion is formed on the first substrate 1, and the source electrode 5 and the drain electrode 6 are preformed on the first substrate 1. The vibration diaphragm 2, the floating gate 7 on the vibration diaphragm 2 and the other part of the spacing portion are formed on the second substrate 12. Then the two parts of the spacing portion are bonded together in a vacuum environment by a bonding process, and finally the second substrate is processed. The second substrate can be completely removed, or a structure as shown in FIG. 2 can be formed. In the structure, the second substrate can protect the vibration diaphragm and the mounting flexibility of the microphone is also improved.

According to the microphone of the present disclosure, the floating gate 7 on the vibration diaphragm can be connected onto pins or into a circuit layout of the first substrate 1 via a lead. Since the spacing portion 3 exists between the vibration diaphragm and the first substrate 1, for an electric connection, one end of the lead is electrically connected to the floating gate 7, and the other end of the lead extends on the vibration diaphragm to the spacing portion 3 and passes through the spacing portion 3 to be connected into the circuit layout of the first substrate 1.

Specifically, referring to FIG. 1, the lead comprises a first conductive portion 8 extending on the vibration diaphragm 2, and a second conductive portion 9 extending in the spacing portion 3. One end of the first conductive portion 8 is electrically connected to the floating gate 7, and the other end of the first conductive portion 8 extends on the vibration diaphragm 2 to the spacing portion 3, and is electrically connected to the second conductive portion 9. The second conductive portion 9 passes through an upper and lower ends of the spacing portion 3, so as to transmit the signal of the floating gate 7 into the circuit layout of the first substrate 1.

In an optional embodiment of the present disclosure as shown in FIG. 1, an ASIC circuit 10 of the microphone can be integrated on the first substrate 1, and the floating gate field effect transistor can be electrically connected to the ASIC circuit 10 via the circuit layout on or in the first substrate 1, so that the electrical signal output by the floating gate field effect transistor can be processed by the ASIC circuit 10.

Figure 3:
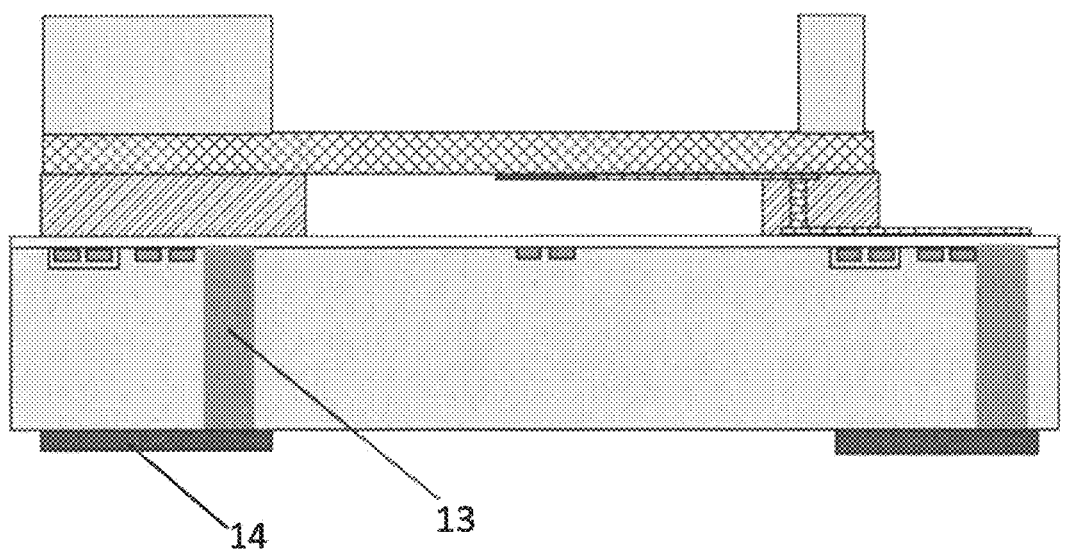
FIG. 3 is a schematic view of one of packaging manners for the microphone of the present disclosure.

The MEMS microphone according to the present disclosure does not require the back cavity with the relatively large volume, so that a wafer level package (WLP) can be completely adopted, and the microphone can be directly mounted on an external terminal without a conventional PCB package. In a specific embodiment of the present disclosure as shown in FIG. 3, a bonding pad 14 is formed at one end of the first substrate 1 that is away from the vacuum chamber 4, and the electrical signal from the first substrate 1 can be introduced onto the bonding pad 14 by a metallized through hole 13, so that the MEMS microphone can be mounted directly via the bonding pad 14.

In another specific embodiment of the present disclosure, externally connected pins can be formed on an upper surface of the first substrate (that is adjacent to the vibration diaphragm), and the microphone can be directly mounted on the external terminal by projection welding (solder ball mounting).

Of course, the MEMS microphone according to the present disclosure may also adopt a conventional package structure, for example, a package structure defined by a circuit board and a shell is provided. The MEMS microphone is mounted in the package structure to form a conventional top or bottom package structure, and is finally mounted on the external terminal in the form of a microphone module.

The present disclosure has been explained in detail by the preferred embodiments. However, variations and additions on the various embodiments are obvious for those ordinary skilled in the art by reading the foregoing context. The applicant intends to include all such variations and additions within the scope of claims of the present disclosure.

Similar numbers refer to similar elements in the text. For the sake of clarity, some of the lines, layers, elements, components or features can be enlarged in the drawings.

The terms used herein are merely for the purpose of illustrating specific embodiments rather than limiting the present disclosure. Unless otherwise defined, all terms (including technical terms and scientific terms) used herein are the same as those understood by the ordinary skilled in the art of the present disclosure.

The invention claimed is:

1. An MEMS microphone, comprising:
a first substrate,
a vibration diaphragm supported above the first substrate by a spacing portion, the first substrate, the spacing portion, and the vibration diaphragm enclosing a vacuum chamber, wherein a static deflection distance of the vibration diaphragm under an atmospheric pressure comprises less than a distance between the vibration diaphragm and the first substrate, and
a floating gate field effect transistor configured to output a varying electrical signal, the floating gate field effect transistor including a source electrode and a drain electrode provided on the first substrate and a floating gate provided on the vibration diaphragm, wherein the vibration diaphragm has a mechanical sensitivity from 0.02 nm/Pa to 0.9 nm/Pa.

2. The MEMS microphone according to claim 1, wherein the floating gate is provided on a side of the vibration diaphragm that is adjacent to or away from the vacuum chamber.

3. The MEMS microphone according to claim 1, wherein the vibration diaphragm comprises a composite structure, the floating gate being provided in the composite structure of the vibration diaphragm.

4. The MEMS microphone according to claim 1, wherein an initial gap between the vibration diaphragm and the first substrate ranges from 1 μm to 100 μm.

5. The MEMS microphone according to claim 1, farther comprising an ASIC circuit integrated on the first substrate.

6. The MEMS microphone according to claim 1, wherein the floating gate on the vibration diaphragm is electrically connected to a circuit layout on the first substrate by a lead.

7. The MEMS microphone according to claim 6, wherein a first end of the lead is electrically connected to the floating gate, and a second end of the lead extends on the vibration diaphragm to the spacing portion and passes through the spacing portion to be connected to the circuit layout on the first substrate.

8. The MEMS microphone according to claim 1, wherein a second substrate is further provided on a side of the vibration diaphragm that is away from the vacuum chamber, and an opening exposing the vibration diaphragm is formed on the second substrate at a position corresponding to a central region of the vibration diaphragm.

9. The MEMS microphone according to claim 1, wherein a bonding pad for an external connection is provided on a side of the first substrate that is away from the vacuum chamber.

* * * * *